United States Patent [19]

Suzuki et al.

[11] 4,021,745
[45] May 3, 1977

[54] PULSE WIDTH MODULATED SIGNAL AMPLIFIER

[75] Inventors: Tadao Suzuki; Tadao Yoshida, both of Tokyo, Japan

[73] Assignee: Sony Corporation, Tokyo, Japan

[22] Filed: Dec. 16, 1975

[21] Appl. No.: 641,244

[30] Foreign Application Priority Data

Dec. 18, 1974 Japan .......................... 49-145470

[52] U.S. Cl. .................................. 330/10; 330/75
[51] Int. Cl.$^2$ ........................................ H03F 3/38
[58] Field of Search ............. 330/9, 10, 75, 207 A; 329/106

[56] References Cited

UNITED STATES PATENTS 3,509,479   4/1970   Glucker et al. ..................... 330/10

*Primary Examiner*—James B. Mullins
*Attorney, Agent, or Firm*—Lewis H. Eslinger; Alvin Sinderbrand

[57] ABSTRACT

A pulse width modulated signal amplifier includes a first input terminal supplied with a rectangular wave signal as a carrier, a second input terminal supplied with a modulating signal, such as an audio signal, an integrator supplied with both the rectangular wave signal and the modulating signal, a high gain amplifier receiving the output of the integrator, a low pass filter receiving the output of the high gain amplifier and producing a demodulated signal corresponding to the modulating signal and which is supplied to an output terminal, and a negative feedback circuit connected between the output of the high gain amplifier and the input of the integrator.

6 Claims, 9 Drawing Figures

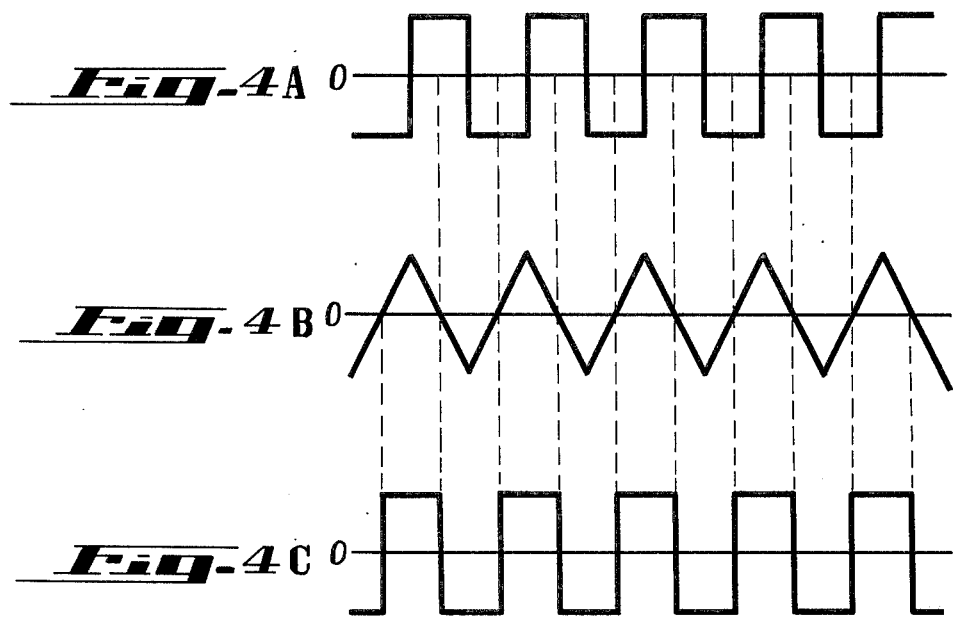
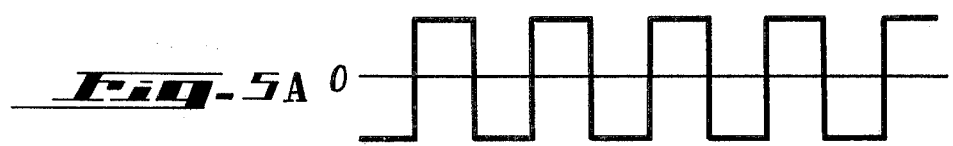
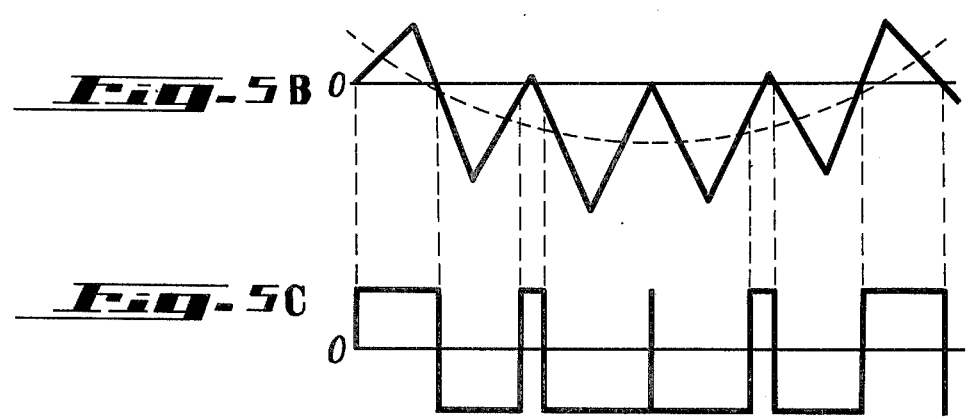

PULSE WIDTH MODULATED SIGNAL AMPLIFIER

BACKGROUND OF THE INVENTION

1. Field of the Invention

The present invention relates generally to a pulse width modulated signal amplifier, and more particularly is directed to improvements in an amplifier of that type which has a stable negative feedback circuit to improve its distortion characteristics.

2. Description of the Prior Art

In the prior art, it is known to use a pulse width modulated amplifier in audio or other amplifiers of the class D type. In such amplifiers, instead of using transistors as variable resistors, transistors are used as switches in the pulse width modulated amplifier. One known method for producing a pulse width modulated signal is to compare a triangular waveform, as a carrier, with the instantaneous level of an input signal as a modulating signal. Another known method does not need an additional carrier to be modulated. For instance, in the latter case, an amplifier with a feedback circuit and higher gain is used to provide the modulating carrier and the input signal to be applied to the amplifier is superimposed on the feedback signal so as to change the ON to OFF ratio of the output signal. Although the last described method for producing a pulse width modulated signal simplifies the construction of the respective amplifier, such method inherently involves rather large distortions. Although it has been suggested to reduce such distortion by providing a feedback that is as large as possible, such large feedback is not an acceptable remedy in that it makes the amplifier unstable by causing oscillation thereof.

OBJECTS AND SUMMARY OF THE INVENTION

Accordingly, an object of the present invention is to provide a pulse width modulated signal amplifier which is free of the above described defects in the prior art.

Another object is to provide a pulse width modulated signal amplifier which has a low distortion characteristic.

A further object is to provide a pulse width modulated signal amplifier which has an excellent distortion characteristic in a rather lower frequency range of the amplified signal.

A still further object of the invention is to provide a pulse width modulated signal amplifier, as aforesaid, which is simple in construction.

In accordance with an embodiment of the present invention, a pulse width modulated signal amplifier includes a first input terminal supplied with a rectangular wave signal as a carrier signal, a second input terminal supplied with a modulating signal, such as an audio signal, for pulse-width-modulating the rectangular wave signal, an integrator supplied with both the output rectangular wave signal and the modulating signal, a high gain or saturation amplifier connected to the output terminal of the integrator, a low pass filter connected to the output terminal of the high gain amplifier and producing a demodulated signal corresponding to the input or modulating signal and which is supplied to an output terminal, and a negative feedback circuit connected between the output terminal of the high gain amplifier and the input terminal of the integrator.

The above and other objects, features and advantages of the present invention, will be apparent from the following detailed description which is to be read in conjunction with the accompanying drawings.

BRIEF DESCRIPTION OF THE DRAWINGS

FIGS. 4A to 4C and FIGS. 5A to 5C are waveform diagrams to which reference will be made in explaining the operation of the embodiment of the invention shown in FIG. 3.

DESCRIPTION OF A PREFERRED EMBODIMENT

Figure 1:
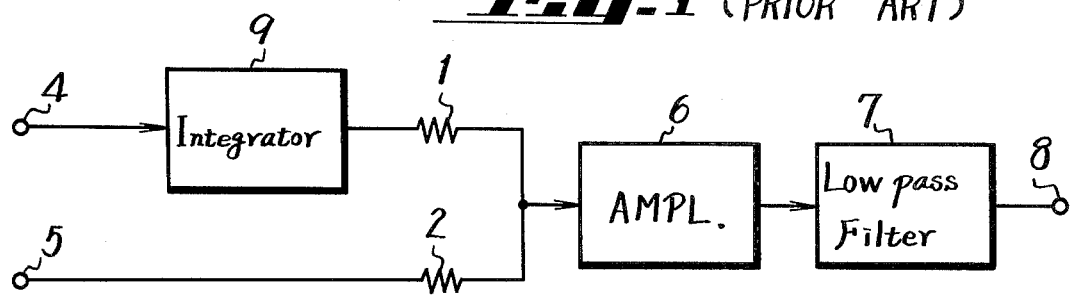
FIG. 1 is a block diagram showing the essential components of a pulse width modulated signal amplifier.

Referring to the drawings in detail, and initially to FIG. 1 thereof, it will be seen that an existing pulse width modulated signal amplifier is provided with input terminals 4 and 5 which are supplied with a rectangular wave signal as a carrier signal and a modulating signal (for example, an audio signal). The rectangular wave signal supplied to the input terminal 4 is fed to an integrator 9 which converts such rectangular wave signal into a triangular or sawtooth waveform signal. This triangular waveform signal from integrator 9 is supplied through a resistor 1 to a high gain amplifier 6 which is also supplied through a resistor 2 with the modulation signal from the input terminal 5. Thus, the high gain amplifier 6 produces a pulse width modulated signal which is then applied to a loss pass filter 7. The low pass filter 7 serves to eliminate the carrier signal contained in the pulse width modulated signal from the high gain amplifier 6 and hence to deliver an amplified output signal corresponding to the original modulating or audio signal to an output terminal 8. In other words, the low pass filter 7 acts as a demodulator.

Figure 2:
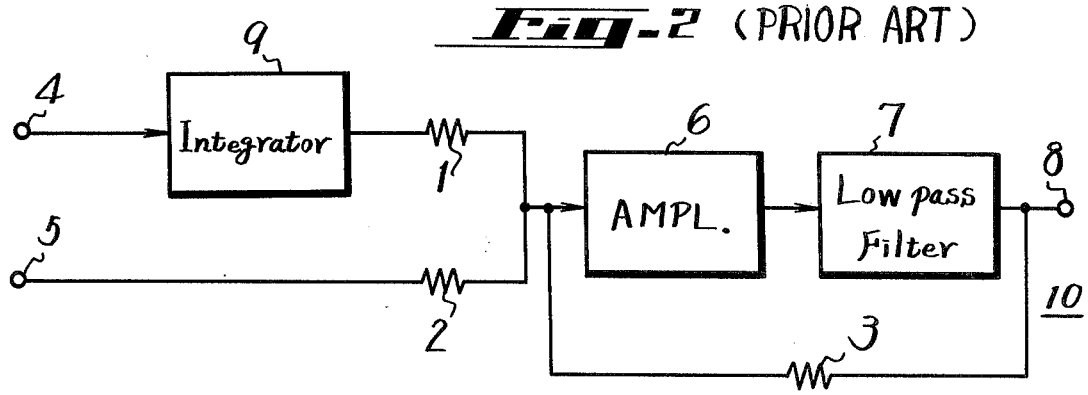
FIG. 2 is a block diagram of a pulse width modulated signal amplifier which is formed by providing a negative feedback circuit in the amplifier of FIG. 1.

In order to reduce the modulation distortion of the pulse width modulated signal amplifier shown in FIG. 1, it has been proposed to provide a negative feedback circuit 10, for example formed by a resistor 3, connected between the output side or terminal of the low pass filter 7 and the input side or terminal of the high gain amplifier 6, as shown in FIG. 2. In the pulse width modulated signal amplifier shown in FIG. 2, the output signal from the low pass filter 7 which is fed back to the high gain amplifier 6 as a negative feedback signal has characteristics that are the reverse of the frequency characteristics of low pass filter 7 so that the distorting effect of such frequency characteristics on the output signal at terminal 8 is reduced. Of course, the extent to which distortions are eliminated by the negative feedback signal is dependent on the level of the latter. However, since the low pass filter 7 imparts a large phase shift to a signal applied thereto, it is necessary to limit the level of the negative feedback signal applied to the high gain amplifier 6 by the negative feedback circuit 10 so as to avoid oscillation and, hence, instability, of the amplifier 6. Therefore, it will be understood that, in the pulse width modulated signal amplifier as shown on FIG. 2, it is impossible to apply a negative feedback signal to the amplifier 6 that is sufficient to very significantly reduce the modulation distortion ratio.

An embodiment of a pulse width modulated signal amplifier according to the present invention which is free of the above mentioned defects of the pulse width modulated signal amplifier shown on FIG. 2, will now be described with reference to FIG. 3 in which components corresponding to those described above with reference to FIGS. 1 and 2 are identified by the same reference numerals.

Figure 3:
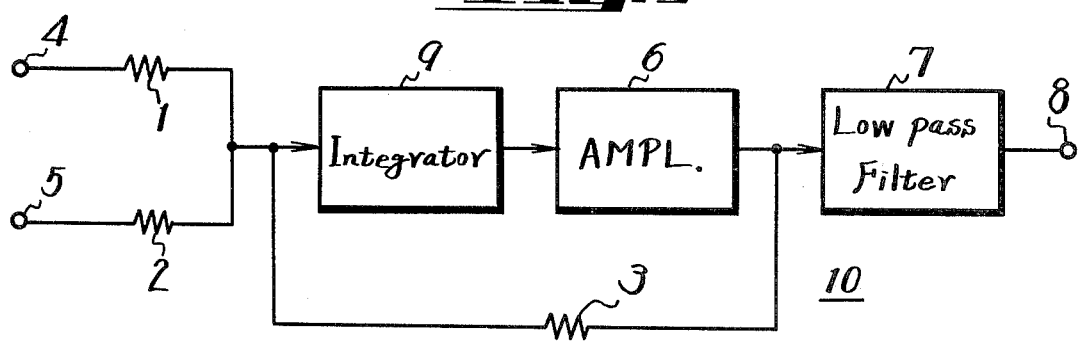
FIG. 3 is a block diagram showing an embodiment of a pulse width modulated signal amplifier according to the present invention.

In the embodiment of FIG. 3, the rectangular wave signal applied to the input terminal 4 and the modulating signal, for example, an audio signal, applied to the input terminal 5 are added together through the resistors 1 and 2 and then supplied to the integrator 9 whose output signal is supplied to the high gain amplifier 6. The output signal from the high gain amplifier 6 is supplied to the low pass filter 7 which delivers its output signal to the output terminal 8. It is to be noted further that, in accordance with this invention, the negative feedback circuit 10 consisting of the resistor 3 is connected between the output side of the high gain amplifier 6 and the input side of the integrator 9.

The operation of the pulse width modulated signal amplifier shown in FIG. 3 will now be described with reference to FIGS. 4A to 4C for the case where the negative feedback circuit 10 is assumed to be omitted from the amplifier shown in FIG. 3. When no modulating signal is supplied to input terminal 5, only a rectangular waveform signal, for example, as shown in FIG. 4A, is supplied from input terminal 4 through resistor 1 to integrator 9. Thus, integrator 9 produces a triangular waveform signal, as shown in FIG. 4B, which is shifted in phase from the rectangular waveform signal of FIG. 4A by just 90°. The triangular waveform signal shown in FIG. 4B is then supplied to the high gain amplifier 6 and, thus, amplifier 6 produces a rectangular waveform signal which is not modulated, as shown in FIG. 4C, but which is shifted in phase by just 90° from the rectangular waveform signal of FIG. 4A.

When a modulating signal is applied to input terminal 5 and supplied through resistor 2 to integrator 9 together with the rectangular waveform signal shown in FIG. 5A, the integrator 9 produces a sum signal of a triangular waveform signal, which is obtained by integrating the rectangular waveform signal of FIG. 5A and the modulating signal, for example, as shown in broken lines on FIG. 5B. The sum signal shown in full lines on FIG. 5B is then applied to high gain amplifier 6, so that amplifier 6 produces a pulse width modulated signal which has its duty ratio corresponding to the level of the modulating signal, as shown in FIG. 5C.

In the pulse width modulated signal amplifier of FIG. 3, the modulating signal is also supplied to the integrator 9 so that the modulating signal has the frequency characteristics of integrator 9 when the negative feedback circuit 10 is omitted. However, the phase of the modulating signal is shifted by 90° in integrator 9, so that when the pulse width modulated signal derived from the high gain amplifier 6 is negatively fed back to the input side of integrator 9, as in the amplifier according to this invention, the negative feedback operation is stable and hence there is no danger that the amplifier 6 be made to oscillate or be unstable. As a result, the frequency characteristics of the modulated signal in respect to the modulating signal can be made flat by applying sufficient negative feedback to the integrator 9. Thus, a pulse width modulated signal which is sufficiently low in modulation distortion ratio can be obtained. Further, the gain of integrator 9 in the low frequency range can be increased so that, as the modulating signal nears a DC signal or has a very low frequency, the amount of the negative feedback can be increased so much to reduce the distortion ratio for such low frequency signal.

In the amplifier according to this invention, the amount of the negative feedback current is preferably selected to be smaller than the current value of the rectangular waveform signal from resistor 1, so that the rectangular waveform signal applied to terminal 4 can be modulated with a modulation ratio of up to 100% by the modulating or audio signal applied to input terminal 5.

Although an illustrative embodiment of this invention has been described in detail herein with reference to the accompanying drawings, it is to be understood that the invention is not limited to that precise embodiment, and that various changes and modifications may be effected therein by one skilled in the art without departing from the scope or spirit of the invention as defined in the appended claims.

What is claimed is:
1. A pulse width modulated signal amplifier comprising first and second input terminals for receiving a rectangular waveform signal as a carrier and a modulating signal, respectively; integrating means having an input and an output; summing means receiving said rectangular waveform signal and said modulating signal for supplying the sum of said rectangular waveform signal and said modulating signal to the input of said integrating means; high gaim amplifying means having an input connected to said output of said integrating means and an output; a low pass filter connected to said output of the high gain amplifying means for producing a demodulated signal; an output terminal receiving said demodulated signal from said low pass filter; and a negative feedback circuit connected between said output of the high gain amplifying means and said input of said integrating means to provide a negative feedback signal at said input of the integrating means which is substantially in phase with a signal provided at said output of the high gain amplifying means and smaller than the rectangular waveform signal so that the modulation ratio of said rectangular waveform signal may be selected as high as 100 percent.

2. A pulse width modulated signal amplifier according to claim 1; in which said summing means includes first and second resistors connected at one end to said first and second input terminals, respectively, and having their other ends connected together to said input of the integrating means.

3. A pulse width modulated signal amplifier according to claim 2; in which said negative feedback circuit consists of a third resistor connected between said output of the high gain amplifying means and said input of the integrating means.

4. A pulse width modulated signal amplifier according to claim 1; in which said negative feedback circuit consists of a resistor connected between said output of the high gain amplifying means and said input of the integrating means.

5. A pulse width modulated signal amplifier comprising first and second input terminals for receiving a rectangular waveform signal as a carrier and a modulating signal, respectively; integrating means having an input and an output; summing means receiving said rectangular waveform signal and said modulating signal for supplying the sum of said rectangular waveform signal and said modulating signal to the input of said integrating means; high gain amplifying means having an input connected to said output of said intergrating means and an output for producing a pulse width modulated signal having a predetermined duty ratio in the absence of a modulating signal, said duty ratio being varied from said predetermined ratio as a function of said modulating signal; a low pass filter connected to said output of the high gain amplifying means for producing a demodulated signal; an output terminal receiving said demodulated signal from said low pass filter; and a negative feedback circuit connected between said output of the high gain amplifying means and said input of said integrating means to provide a negative feedback signal at said input of the integrating means which is substantially in phase with said pulse width modulated signal provided at said output of the high gain amplifying means and smaller than the rectangular waveform signal so that the modulation ratio of said rectangular waveform signal may be selected as high as 100 percent.

6. A pulse width modulated signal amplifier according to claim 5; in which said negative feedback circuit consists of a resistor connected between said output of the high gain amplifying means and said input of the integrating means.

* * * * *